United States Patent [19]

Leibowitz

[11] Patent Number: 4,513,055
[45] Date of Patent: Apr. 23, 1985

[54] CONTROLLED THERMAL EXPANSION COMPOSITE AND PRINTED CIRCUIT BOARD EMBODYING SAME

[75] Inventor: Joseph D. Leibowitz, Culver City, Calif.

[73] Assignee: TRW Inc., Redondo Beach, Calif.

[21] Appl. No.: 325,810

[22] Filed: Nov. 30, 1981

[51] Int. Cl.³ .................. B32B 7/00; D03D 3/00; H01B 17/54
[52] U.S. Cl. .................. 428/245; 428/901; 428/259; 174/68.5
[58] Field of Search .......... 428/245, 251, 252, 259, 428/901, 258, 225, 257; 174/68.5

[56] References Cited

U.S. PATENT DOCUMENTS

| | | |
|---|---|---|
| 2,650,184 | 8/1953 | Biefeld . |
| 3,073,004 | 1/1963 | Zeise . |
| 3,486,966 | 12/1969 | Allen et al. . |
| 3,700,538 | 10/1972 | Kennedy . |
| 3,722,355 | 3/1973 | King . |
| 3,756,901 | 9/1973 | Veneziale ............................ 428/246 |
| 3,878,316 | 4/1975 | Groff ................................... 174/68.5 |
| 3,897,588 | 7/1975 | Nohtomi . |
| 3,934,067 | 1/1976 | Goldman et al. . |
| 3,940,534 | 2/1976 | Fick et al. . |
| 3,950,868 | 4/1976 | Holroyd et al. ....................... 428/259 |
| 3,955,024 | 5/1976 | Goldman et al. . |
| 3,988,490 | 10/1976 | Holroyd et al. ....................... 428/251 |
| 4,020,209 | 4/1977 | Yuan . |
| 4,035,694 | 9/1977 | Barton . |
| 4,103,102 | 7/1978 | Klein . |
| 4,139,591 | 2/1979 | Jurisich . |
| 4,191,800 | 3/1980 | Holtzman . |
| 4,241,132 | 12/1980 | Pratt et al. . |
| 4,282,011 | 8/1981 | Terpay ............................... 428/259 |
| 4,318,954 | 3/1982 | Jensen . |
| 4,368,234 | 1/1983 | Palmer et al. ....................... 428/245 |

OTHER PUBLICATIONS

IEE Transactions-S. Greer, Mar. 1979.
Howe Industries-Kelvar Update, Nov. 23, 1981.
Nepcon Symposium, Hermetic Ceramic Chip Carriers-Fennimore, Mar. 1981.

Primary Examiner—George F. Lesmes
Assistant Examiner—Beverly K. Johnson
Attorney, Agent, or Firm—Donald R. Nyhagen; Noel F. Heal

[57] ABSTRACT

A composite characterized by a controlled coefficient of thermal expansion and comprising a thermal coefficient control fabric embedded in a resin matrix and composed of yarns with positive and negative coefficients of thermal expansion. A composite circuit board constructed of the composite and having a coefficient of thermal expansion matched to a particular integrated chip carrier material, such as aluminum oxide.

4 Claims, 4 Drawing Figures

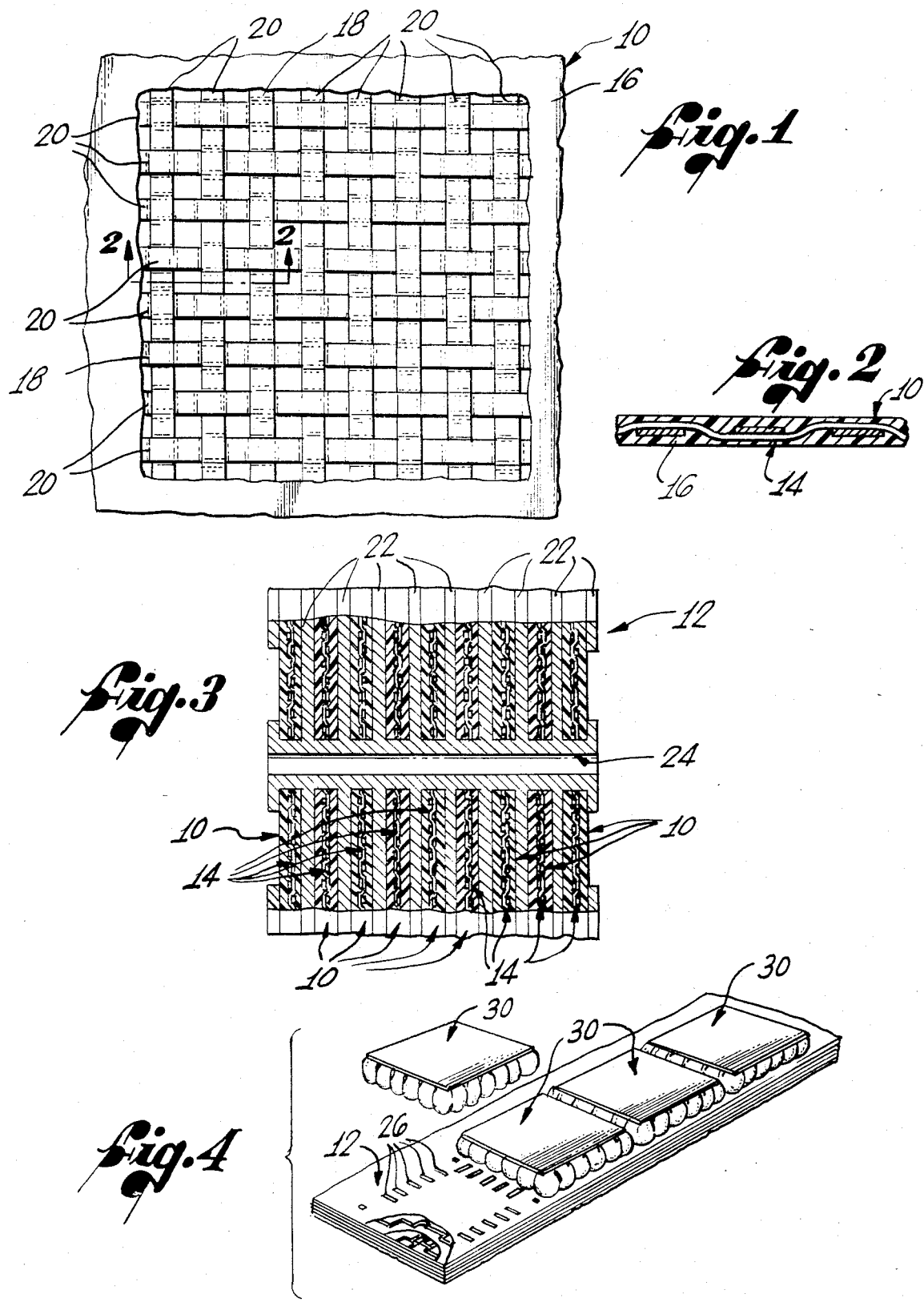

CONTROLLED THERMAL EXPANSION COMPOSITE AND PRINTED CIRCUIT BOARD EMBODYING SAME

BACKGROUND OF THE INVENTION

This invention relates generally to composite materials characterized by a controlled coefficient of thermal expansion and, more particularly, to such a composite material which may be fabricated to have any selected thermal coefficient within a prescribed coefficient range. The invention relates also to a circuit board constructed of the composite material, whereby integrated circuit chip carriers can be directly mounted on the board without differential expansion problems.

According to its broader aspects, the invention provides a composite material of the class described which is adapted for use in any application in which the controlled thermal coefficient of the material is useful. The primary application of the composite material, however, is printed circuit boards, and for this reason the invention will be described in the context of such circuit boards.

For many years, integrated circuit chips were packaged almost exclusively in the form of flat-pack packages or dual in-line packages, known as DIPs. A dual in-line package has two rows of leads that can be inserted in holes for soldering to circuit boards. In recent years, the use of much smaller chip carriers has emerged as a more desirable packaging technique for integrated circuits. Chip carriers are usually fabricated from a ceramic material, such as aluminum oxide, and produced as a hermetically sealed package for each chip. Bonded leads are brought out from the chip to the edges of the chip carrier, and ideally the carrier is then soldered, by its leads, directly to a circuit board. The principal advantage of this structure is a significantly higher circuit density. Also, shorter and more uniform lead lengths result in improved speed and impedence characteristics. Furthermore, use of chip carriers substantially reduces the overall cost of a circuit package. Package size reductions as high as five-to-one ratio can be obtained, compared with an equivalent dual in-line package construction.

A major drawback to the use of chip carriers in that the coefficient of thermal expansion of aluminum oxide, the most commonly used ceramic chip carrier material, is approximately one-half the coefficient of thermal expansion for glass/epoxy laminates typically used in the manufacture of circuit boards. When the resulting structure is exposed to any significant range of temperatures, the thermal cycling of the structure can crack soldered joints and render the circuit inoperative. One solution to this problem is to place between the chip carrier and the circuit board and intermediate member which accommodates relative thermal expansion and contraction of the chip carriers and circuit board. The circuit board is sometimes referred to as a mother board and the intermediate member as a baby board. The intermediate member may also take the form of a hybrid package on which the chip carrier is mounted. Another technique is to use a compliant lead structure between the chip carrier and the circuit board, although this clearly increases the cost of the package and results in inherently long lead lengths.

It will be appreciated from the foregoing that there has been a significant need for a new technique that reduces or eliminates this problem of mismatch between the coefficients of thermal expansion of chip carriers and the circuit boards on which they are mounted. The present invention satisfies this need.

SUMMARY OF THE INVENTION

According to one of its aspects, the present invention provides a circuit board for mounting integrated circuit chip carriers and having a coefficient of thermal expansion closely matching that of the material of the chip carriers. The chip carriers may thus be mounted directly on the circuit board with the carrier terminals bonded directly to the board terminals, thereby eliminating the need for means, such as compliant leads or an intermediate member (baby board) between the chip carriers and circuit board, to accommodate relative thermal expansion and contraction of the carriers and board.

The composite circuit board of the invention comprises a thermal coefficient (i.e., coefficient of thermal expansion) control fabric embedded in a resin matrix and composed of yarns of two different materials, one of which has a negative coefficient of thermal expansion and the other of which has a positive coefficient of thermal expansion. The resin matrix may comprise any suitable resin, such as epoxy resin, polyimide resin or polytetrafluoroethylene resin. The proportions of the two yarns used in the thermal coefficient control fabric will be selected to provide the finished board with the desired thermal coefficient and will depend on a variety of factors, including the thermal coefficients and relative volumes of the yarns, resin, and copper in the finished circuit board. By way of example, when the negative coefficient material is Kevlar fiber (trademark of E.I. du Pont de Nemours & Co., Inc.) which is aramid fiber sold by Du Pont, a woven structure incorporating approximately 70–80 percent Kevlar results in a coefficient of thermal expansion approximating that of aluminum oxide ($3.33 \times 10^{-6}/°F.$).

It will be appreciated from the foregoing that the invention allows the mounting of aluminum oxide chip carriers directly to a printed circuit board without any of the usual problems arising from different thermal expansion rates of the chip carrier and the circuit board. Therefore, the invention will greatly facilitate the use of chip carrier construction and will minimize the problems relating to this circuit packaging technique. It will also be recognized, however, that the composite material (i.e., resin matrix and embedded thermal control fabric) of the circuit board may be used for other applications which require the thermal characteristics of the material.

According to a broader aspect, therefore, the invention provides a composite material capable of general application and characterized by a controlled coefficient of thermal expansion which may be selected to have any value within a prescribed range of coefficient values. Other aspect and advantages of the present invention will become apparent from the following more detailed description, taken in conjunction with the accompanying drawings.

BRIEF DESCRIPTION OF THE DRAWINGS

FIG. 1 is a plan view of a composite circuit board according to the invention, partly broken away to show the thermal coefficient control fabric embedded in the board;

FIG. 2 is a sectional view taken substantially along the line 2—2 in FIG. 1;

FIG. 3 is a fragmentary sectional view of a laminated circuit board construction according to the invention including composite circuit board layers of the kind shown in FIG. 1; and FIG. 4 is a fragmentary perspective view of a composite circuit board construction according to the invention including integrated circuit chip carriers mounted directly on the composite circuit board proper.

DETAILED DESCRIPTION

As mentioned earlier and shown in the drawings for purposes of illustration, one aspect of the present invention is concerned with a composite printed circuit board which permits aluminum oxide chip carriers to be mounted directly onto the circuit board proper while avoiding the usual problems resulting from differential thermal expansion rates of the board and carriers. In accordance with this aspect of the invention, the circuit board is constructed of a composite material comprising a thermal coefficient control fabric embedded in a resin matrix and composed of some yarns having a positive coefficient of thermal expansion and some yarns having a negative coefficient of thermal expansion. The matrix may comprise a resin such as epoxy resin, a polyimide resin, or polytetrafluoroethylene resin. The yarn with the positive coefficient of thermal expansion may be a glass fiber, and the yarn having the negative coefficient of thermal expansion may be Kevlar fiber (trademark of E.I. du Pont de Nemours & Co. Inc.). The overall thermal coefficient of the composite circuit board depends upon a variety of parameters including the thermal coefficients and relative volumes of the resin, yarns, and copper present in the final circuit board construction. The overall thermal coefficient of the composite circuit board may be regulated or adjusted to closely match the thermal coefficient of the chip carriers by varying one or more of these parameters, and particularly the ratio of volumes (and hence weights) of the positive and negative thermal coefficient yarns in the thermal coefficient control fabric. This matching of the thermal coefficient of the circuit board to that of the chip carriers, of course, substantially eliminates any relative thermal expansion and contraction of the board and chip carriers and hence the need to compensate for such relative thermal expansion and contraction.

Referring to the drawings, FIGS. 1 and 2 show one layer 10 of a multilayer composite circuit board 12 (FIG. 3) according to the invention. The layer is a composite structure including a thermal coefficient control fabric 14 embedded in a resin matrix 16. The composite layer 10 is typically on the order of 0.006 inches in thickness and is fabricated in the manner described later.

The thermal coefficient control fabric 14 is composed of yarns 18 and 20 having positive and negative coefficients of thermal expansion, respectively, woven together in any suitable weave pattern to form a woven fabric. The particular fabric shown has a plain weave pattern. Other weave patterns may be utilized. As noted earlier, the positive coefficient yarn 18 may be Fiberglas and the negative coefficient yarn 20 may be Kevlar.

The laminated multilayer circuit board 12 in FIG. 3 is conventional except for its composite layers 10. Accordingly, a detailed description of the circuit board is not necessary. Suffice it to say that the circuit board 12 comprises a number, typically 8 to 10, composite layers 10 arranged side by side in alternate sequence with copper layers 22. These copper layers are electrically connected by plated-through holes 24 or other connecting means and etched in the usual way to define prescribed circuit paths connecting to terminals 26 (FIG. 4), such as pads or the like, on the outer side or sides of the circuit board for connection to terminals of circuit elements mounted on the circuit board 12.

It will be understood at this point that the coefficient of thermal expansion of a circuit board according to the invention may be adjusted over a range of coefficient values by varying any one or more of the coefficient varying parameters mentioned earlier and primarily then ratio of the positive coefficient and negative coefficient yarns 18 and 20 in the thermal coefficient control fabric 14. In this regard, it was noted earlier that a circuit board according to the invention using a coefficient control fabric constructed of Kevlar or Fiberglas yarns incorporating approximately 70% to 80% Kevlar yarn has a thermal coefficient approximating that $(3.33 \times 10^{-6}/°F.)$ of the aluminum oxide used for integrated circuit chip carriers.

By way of specific example, such a printed circuit board was fabricated using a thermal coefficient control fabric made from Kevlar 49 yarn manufactured by duPont and a glass yarn manufactured by Owens-Corning and designated S-2CG150-1/o 1Z. The Kevlar yarn 49 and 195 denier, and each yarn comprised 134 filaments of a diameter of 0.00049 inch. The glass yarn was of 197.6 denier, and each yarn had 204 filaments of a diameter 0.00036 inch. To provide 80% by weight of Kevlar, these yarns were woven in the ratio twelve yarns of Kevlar to two yarns of glass in both the woof and the warp directions. Owens-Corning 493 epoxy-compatible sizing was used for lubrication and, during weaving, a 10% solution by volume of polyvinyl acetate was sprayed into the warp yarns to facilitate the weaving process.

On completion of the weaving operation, the polyvinyl acetate was removed, since it would inhibit the epoxy resin from adhering to the woven fabric. Removal was effected by soaking the fabric in a mixture of Merpol HCS (duPont) four ounces per gallon, Liqui-Nox liquid detergent 0.5 ounces per gallon, concentrated ammonia approximately one liter per twenty-five gallons and deionized water heated to 150° F. The woven fabric was thus soaked for several hours, with specific agitation, then rinsed in cold and then hot deionized water until the pH level was neutral. The fabric was then baked at 175° F. until dry.

The dried fabric was passed through a bath of epoxy or other resin, and then excess resin was removed as the material passed through a set of rollers to obtain resin impregnated fabric sheets of desired thickness and resin content to form the composite layers 10 of the completed circuit board 12. These layers were then cured by heating. Some layers were cured only to an intermediate stage and laminated with copper foil on both sides while still in a tacky condition, and then fully cured. The copper was then appropriately etched to define desired circuit paths. These copper-laminated layers were then placed together with other partially cured layers, and the whole structure was then fully cured to form a composite circuit board 12.

Following are examples summarizing the pertinent characteristics of other test circuit boards according to the invention which were fabricated using an epoxy resin manufactured in accordance with a military specification for glass printed circuit boards (MIL-P-55110C). The Kevlar yarn was Kevlar 49 and the glass yarn was Owens-Corning S-2CG150-1/o 1Z.

Example 1

The ratio of Kevlar yarn to glass was 80:20 (by weight) arranged in a plain weave. The thickness of each ply or layer was 4.8 mils and the resin content before curing was 49.8%. The coefficient of thermal expansion measured over the range 10°–212° F. was $2.67 \times 10^{-6}/°F.$ in the warp direction and $3.31 \times 10^{-6}/°F.$ in the woof direction.

EXAMPLE 2

The ratio of Kevlar yarn to glass was 66:34 (by weight) arranged in a plain weave. The thickness of each ply or layer was 4.8 mils and the resin content before curing was 50.2 percent. The coefficient of thermal expansion was $3.33 \times 10^{-6}/°F.$ in the woof direction.

FIG. 4 illustrates a circuit board 12 according to the invention whose coefficient of thermal expansion is approximately matched to that of integrated circuit chip carriers 30 mounted directly (i.e., without an intervening baby board or other intermediate member) on the board. In this case, the circuit board terminals 28 are directly connected, as by a reflow soldering process, to the chip carrier terminals. The board terminals may be solder pads. The carrier terminals may be leads which are extended to the outer edges and then under the chip carriers.

It will be appreciated from the foregoing description that the invention represents a significant advance in the field of electronics packaging. In particular, the invention provides a technique for matching the coefficient of thermal expansion of a circuit board with that of integrated circuit chip carriers, thereby greatly simplifying and enhancing the reliability of chip carriers mounted on circuit boards and reducing their cost. It will also be appreciated that while specific examples of the invention have been described in detail, these are for purposes of illustration only.

It will also be recognized at this point that while FIGS. 1 and 2 were described above in the context of a composite layer for a laminar printed circuit board, the structure shown in these figures can be more broadly regarded as a composite material characterized by a controlled coefficient of thermal expansion which may be adjusted over a range of coefficient values by varying the ratio of the positive and negative coefficient yarns 18, 20. This composite material constitutes a second aspect of the invention and may be used for purposes other than the described circuit board application. Obviously, in these other uses, the composite material may be laminated in a manner similar to that shown in FIG. 3.

We claim:

1. A composite comprising:
   a resin matrix,
   a woven thermal expansion coefficient control fabric embedded in said resin matrix including a first group of generally parallel first and second yarns and a second group of generally parallel first and second yarns extending transverse to the yarns of said first group,
   said first yarns having a positive coefficient of thermal expansion, and
   said second yarns having a negative coefficient of thermal expansion.

2. The composite of claim 1 wherein: p1 said first yarns comprise glass fibers and said second yarns comprise aramid fibers.

3. A laminated composite comprising:
   a plurality of layers each comprising a resin matrix and a woven thermal expansion coefficient contral fabric embedded in said resin matrix including a first group of generally parallel first and second yarns and a second group of generally parallel first and second yarns extending transverse to the yarns of said first group,
   said first yarns having a positive coefficient of thermal expansion and
   said second yarns having a negative coefficient of thermal expansion.

4. The composite of claim 3 wherein:
   said first yarns comprise glass fibers and said second yarns comprise aramid fibers.

* * * * *